INVENTOR
Lee V. Gorman

BY
Stevens, Davis, Miller & Mosher
ATTORNEYS

United States Patent Office 3,242,391

Patented Mar. 22, 1966

3,242,391

GOLD-GERMANIUM EUTECTIC ALLOY FOR CONTACT AND ALLOY MEDIUM ON SEMICONDUCTOR DEVICES

Lee V. Gorman, Richardson, Tex., assignor to Texas Instruments Incorporated, Dallas, Tex., a corporation of Delaware Filed Mar. 2, 1962, Ser. No. 177,068
4 Claims. (Cl. 317—234)

This invention relates to a gold-germanium eutectic alloy and more particularly to the use of a gold-germanium eutectic alloy as a solder or bonding agent to join nickel and gold surfaces.

In accordance with this invention a gold-germanium eutectic mixture is used to solder semiconductor devices having a chemically deposited nickel surface thereon to a gold plated Kovar (an iron, nickel, cobalt alloy) header or other gold surfaced device. The melting point of the gold-germanium alloy is 356° C. Accordingly, electronic devices can be operated at or stored at temperatures more than 100° C. higher than previous devices using such materials as Indalloy #11 solder (95% Pb, 5% In) or other prior art solders for this purpose. The gold-germanium alloy will tend to increase the electrical conductivity of electronic devices at the contact point and will decrease the thermoresistance in electronic devices by at least a factor of five.

It is an object of this invention to provide a gold-germanium alloy bonding of nickel surfaces to gold surfaces.

It is a further object of this invention to provide a gold-germanium eutectic alloy for bonding nickel plated semiconductor wafers to gold plated surfaces.

It is a still further object of this invention to provide a method of bonding nickel surfaces to gold surfaces with a gold-germanium alloy.

These and other objects and features of the invention will best be understood in conjunction with the appended claims and with reference to the accompanying drawings in which:

Figure 1:
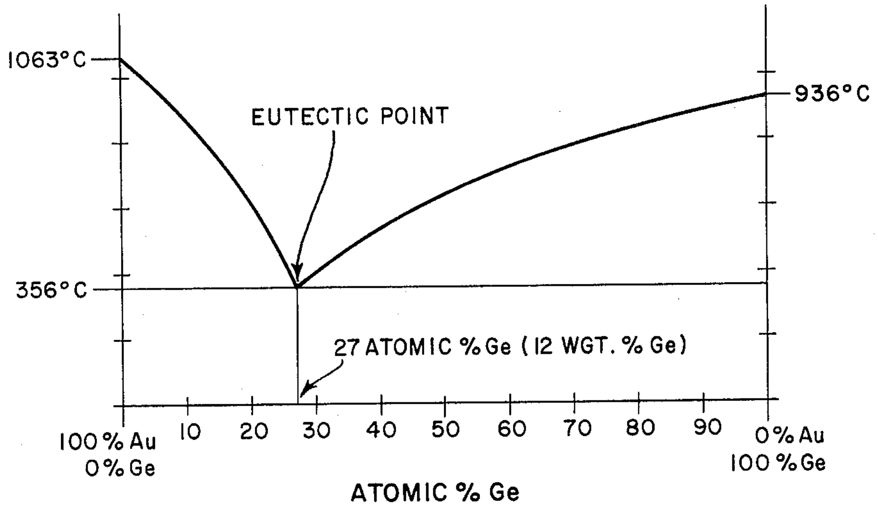
FIGURE 1 is a gold-germanium phase diagram.

Initially, a eutectic mixture of gold and germanium consisting of 88% by weight of gold and 12% by weight of germanium are placed together in a crucible. These percentages correspond to the percentages of gold and germanium found in the alloy at the eutectic point temperature of 356° C. (FIGURE 1). The abovementioned weight range can vary within 3% by weight of the germanium. The crucible containing the gold and the germanium is placed in a non-oxidizing atmosphere such as hydrogen, a vacuum, etc., and is heated to a temperature in excess of 1063° C. to be certain that both the gold and germanium have melted in the crucible, 1063° C. being the melting point of the highest melting component, namely gold. After the gold and germanium have melted the mixture is slowly cooled. (It should be noted that if the final eutectic alloy is to be used for evaporation purposes the slow cool is not necessary.) The cooled mixture is then annealed when it reaches a temperature of preferably 300° C. but at least less than 365° C., the melting temperature of the eutectic alloy which is formed. An annealing time in excess of six hours may be used with the eutectic alloy suffering no harmful results.

Pre-forms are then produced from the eutectic alloy by hot rolling the alloy at a temperature of about 300° C. and then cutting into the desired shapes. The preforms need not be slow cooled from the 300° C. temperature to room temperature since they have already been annealed.

Figure 2:
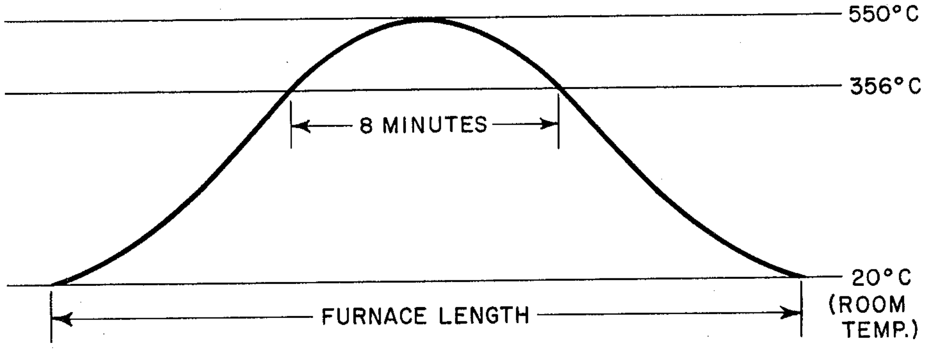
FIGURE 2 is a furnace temperature profile.

After the pre-forms have been fabricated, they are placed in contact with the metal surface on which they are to be bonded as, for example, a nickel plated collector region of a transistor. The alloy will also be placed in contact with a gold surface such as the gold plated surface of a Kovar header for a transistor. In order to form the bond between the pre-form and the transistor collector, the unit is heated in a non-oxidizing atmosphere to a temperature in excess of 356° C. and preferably in excess of 400° C. The heating may be accomplished by transporting the unit through a furnace having a temperature profile as illustrated in FIGURE 2. The bonding temperature must, of necessity, be higher than the melting point of the eutectic mixture in order to bond together the nickel and gold surface. The heating in excess of 356° C. will last for a period of about eight minutes although this time is not critical (FIGURE 2). This temperature is merely a suggested time and temperature for good results. The alloy bonded gold plated Kovar header and nickel plated collector region of the transistor is then slowly cooled to room temperature.

Figure 3:
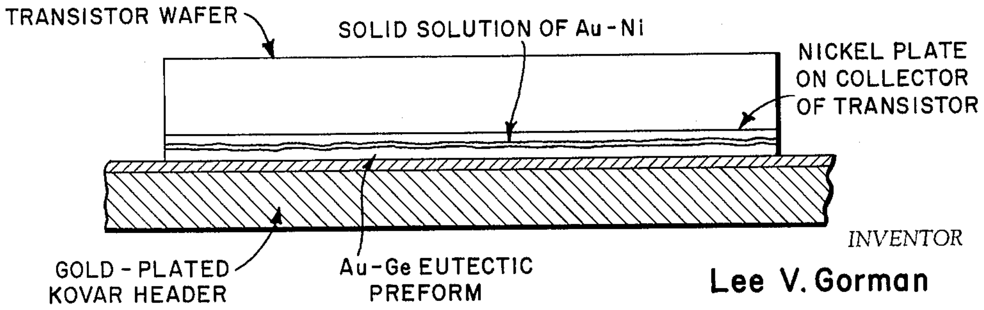
FIGURE 3 is a diagram of the layers that are formed when bonding a nickel plated semiconductor wafer to a gold surfaced device with the alloys of the invention.

Referring to FIGURE 3, it is noted that when the alloy melts in accordance with the eutectic curve as set forth in FIGURE 1, a gold rich phase and a germanium rich phase are in equilibrium with themselves, there being two points on the curve at which to operate at a particular temperature in this range. For example, at 550° C. a gold rich phase of about 19 atomic percent germanium and 81 atomic percent gold is in equilibrium with a germanium rich phase of 42 atomic percent germanium and 58 atomic percent gold. The average of these two in equilibrium is the eutectic mixture.

The bond that the eutectic alloy makes with the nickel surface is two-fold. At 500° C. the nickel is far below its melting point. However, the gold-germanium eutectic alloy is in the molten state though the temperature is substantially below the melting point of gold or germanium taken alone. Reference to a solid solubility curve between nickel and gold will reveal the fact that a very minute amount of gold will go into solution with nickel metal at 550° C. since the gold-germanium eutectic is a gold rich mixture (88% by weight gold). When the eutectic alloy is returned to room temperature most of the gold that went into solid solution with the nickel metal precipitates out and goes back into the gold-germanium eutectic mixture. However, a very small amount of gold still remains in solid solubility form with the nickel metal. Thus, as represented in FIGURE 3, a very thin layer of gold-nickel as represented by the composite solubility is formed between the gold-germanium eutectic alloy and the nickel surface. Normally, and especially for electroless nickel plated surfaces, the surface of the nickel will be granular in nature and very porous. The gold-germanium eutectic alloy fills up the porous nickel surface and forms a bond, this bond being a result of the difference in the coefficient of expansion of the gold-germanium eutectic alloy and the nickel surface. Thus, a bond is formed between the gold-germanium eutectic alloy and the nickel surface.

*Example*

82 grams of gold and 12 grams of germanium were placed together in a crucible in an inert atmosphere of hydrogen gas and heated to a temperature slightly in excess of 1063° C. The mixture was then cooled from the temperature in excess of 1063° C. to 300° C. at a rate of cooling of less than 10° C. per minute. The alloy was then annealed at 300° C. for six hours. Subsequently, the alloy was slow cooled to room temperature at a rate of about 100° C. per hour.

The annealed eutectic alloy was then hot rolled at a temperature of 300° C. and cut into pre-forms. The preforms were placed in contact with the nickel surface of a nickel plated collector of a transistor and the gold surface of a gold plated Kovar header for a transistor. The unit was then heated in a hydrogen atmosphere to a temperature of 550° C., the temperature being maintained above 356° C., the melting point of the eutectic mixture for a period of eight minutes. The bonded collector and header structure was then cooled to room temperature.

The times and temperatures, weights, percentages, etc., have been specified for a specific example; however, other times and temperatures may also be used, the exemplary values being only preferred conditions.

Although the invention has been described with respect to a specific embodiment, many variations will be obvious to those skilled in the art. Accordingly, the invention is limited only by the scope of the appended claims.

What is claimed is:

1. The method of mounting a semiconductor device onto a header comprising the steps of:

(a) coating a portion of the semiconductor device with nickel, (b) coating a portion of the header with gold, (c) assembling said device and said header together with an interposing alloy layer consisting of about 88% gold and 12% germanium, and (d) heating the assembly to a temperature in excess of 356° C. to bond said layer to said nickel and said gold.

2. The method of mounting a semiconductor device onto a header comprising the steps of:

(a) coating a portion of the semiconductor device with nickel, (b) coating a portion of the header with gold, (c) assembling said device and said header together with an interposing alloy layer consisting of about 9 to 15 percent germanium and the remainder gold, and (d) heating the assembly to a temperature in excess of 356° C. to bond said layer to said nickel and said gold.

3. A semiconductor structure comprising:

(a) a semiconductor device, (b) a support therefor, (c) a nickel coating on a portion of said semiconductor device, (d) a gold coating on said support, and (e) an alloy layer consisting of about 9 to 15 percent germanium and the remainder gold interposed between said nickel coating and said gold coating for attaching said device to said support.

4. A semiconductor structure comprising:

(a) a semiconductor device, (b) a support therefor, (c) a nickel coating on a portion of said semiconductor device, (d) a gold coating on said support, and (e) an alloy layer consisting of about 12 percent germanium and 88 percent gold interposed between said nickel coating and said gold coating for attaching said device to said support.

References Cited by the Examiner

UNITED STATES PATENTS

| | | | |
|---|---|---|---|
| 2,796,563 | 6/1957 | Ebers | 317—235 |
| 2,935,453 | 5/1960 | Saubestre | 317—235 |
| 2,942,166 | 6/1960 | Michlin | 317—234 |

JOHN W. HUCKERT, *Primary Examiner.*

JAMES D. KALLAM, *Examiner.*